(12) United States Patent
Dobos et al.

(10) Patent No.: US 12,356,130 B2
(45) Date of Patent: Jul. 8, 2025

(54) MICROPHONE ARRANGEMENT

(71) Applicant: Harman International Industries, Incorporated, Stamford, CT (US)

(72) Inventors: Viktor Dobos, Kecskemét (HU); Péter Atilla Kardos, Budapest (HU); Zoltán Giang-Son Kleinheincz, Pilisborosjen (HU); Péter Tamás Podlócz, Budapest (HU)

(73) Assignee: Harman International Industries, Incorporated, Stamford, CT (US)

( * ) Notice: Subject to any disclaimer, the term of this patent is extended or adjusted under 35 U.S.C. 154(b) by 266 days.

(21) Appl. No.: 18/311,581

(22) Filed: May 3, 2023

(65) Prior Publication Data
US 2023/0370757 A1    Nov. 16, 2023

(30) Foreign Application Priority Data
May 11, 2022   (EP) ..................... 22172679

(51) Int. Cl.
| | |
|---|---|
| H04R 1/08 | (2006.01) |
| E05B 81/78 | (2014.01) |
| E05B 85/10 | (2014.01) |
| H05K 1/18 | (2006.01) |

(52) U.S. Cl.
CPC ............. H04R 1/086 (2013.01); H05K 1/181 (2013.01); *E05B 81/78* (2013.01); *E05B 85/107* (2013.01); *H04R 2499/13* (2013.01); *H05K 2201/10083* (2013.01)

(58) Field of Classification Search
CPC ................... H04R 1/086; H05K 1/181; H05K 2201/10083; E05B 81/78; E05B 85/107
USPC .......................... 381/150, 361, 355, 365, 366
See application file for complete search history.

(56) References Cited

U.S. PATENT DOCUMENTS

2005/0074131 A1    4/2005   Mc Call
2008/0238615 A1*  10/2008   Carpenter ............. B62B 3/1424
                                                                340/5.91

FOREIGN PATENT DOCUMENTS

| CN | 112298104 A | 2/2021 |
| CN | 212556129 U | 2/2021 |
| DE | 102019130141 A1 | 5/2021 |

* cited by examiner

*Primary Examiner* — Thjuan K Addy
(74) *Attorney, Agent, or Firm* — Angela Brunetti

(57) ABSTRACT

A microphone arrangement comprises a retractable door handle that, when in a closed position, is retracted in a body work of a vehicle, and, when in an in-use position, protrudes from the body work of the vehicle.

19 Claims, 3 Drawing Sheets

MICROPHONE ARRANGEMENT

CROSS REFERENCE

Priority is claimed to application serial no. EP22172679.7, filed May 11, 2022, in Europe, the disclosure of which is incorporated in its entirety by reference.

TECHNICAL FIELD

The disclosure relates to a microphone arrangement, in particular to a microphone arrangement for a vehicle.

BACKGROUND

Microphones may need to be arranged on an exterior portion of an automobile in order to support a plurality of vehicle applications by detecting sound outside of the automobile. Such microphones may need to be impervious to various environmental conditions such as wind, rain, snow, etc. Additionally, such microphones may be positioned on the vehicle exterior and should provide an appealing aesthetic appearance for vehicle occupants by not marring the exterior styling of the vehicle.

SUMMARY

A microphone arrangement includes a retractable door handle, a handle housing and at least one microphone. When the retractable door handle is in a closed position, it is retracted in a body work of a vehicle, and, when in an in-use position, it protrudes from the body work of the vehicle. The handle housing, when the retractable door handle is in its closed position, is covered by the retractable door handle. The at least one microphone comprises a microphone element arranged in a housing. The housing comprises a first opening to enable the respective microphone element to detect sound, wherein the at least one microphone is mounted to the handle housing such that the first opening is completely covered by the retractable door handle when in its closed position. The first opening is exposed to outside air such that sound may enter the first opening, when the retractable door handle is in its in-use position. The at least one microphone is mounted to the retractable door handle such that the first opening is completely covered by the body work when the retractable door handle is in its closed position. The first opening is exposed to outside air such that sound may enter the first opening, when the retractable door handle is in its in-use position.

A vehicle includes a first microphone arrangement mounted to a driver's door of the vehicle, and/or a second microphone arrangement mounted to a passenger door of the vehicle.

Other systems, methods, features, and advantages will be or will become apparent to one with skill in the art upon examination of the following detailed description and figures. It is intended that all such additional systems, methods, features, and advantages be included within this description, be within the scope of the invention and be protected by the following claims.

BRIEF DESCRIPTION OF THE DRAWINGS

The arrangement may be better understood with reference to the following description and drawings. The components in the figures are not necessarily to scale, emphasis instead being placed upon illustrating the principles of the invention. Moreover, in the figures, like referenced numerals designate corresponding parts throughout the different views.

DETAILED DESCRIPTION

As required, detailed embodiments of the present invention are disclosed herein; however, it is to be understood that the disclosed embodiments are merely examples of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

It is recognized that directional terms that may be noted herein (e.g., "upper," "lower," "inner," "outer", "top", "bottom", etc.) simply refer to the orientation of various components of an arrangement as illustrated in the accompanying figures. Such terms are provided for context and understanding of the disclosed embodiments.

Due to the developments in the automotive industry, it has become necessary to detect sounds from the outside (or external environment) of a vehicle. For example, voice recognition may be used to unlock a vehicle or to activate one or more functions of the vehicle. For example, a driver's seat may be positioned, and an air conditioning and entertainment system could be programmed according to a driver's preferences, if a driver has been identified by means of voice recognition. The detection of sounds from the outside may also be necessary for many other applications. This may necessitate the installation of any number of microphones on an exterior of a vehicle. In order to function properly over the lifetime of the vehicle, the microphones not only have to withstand environmental conditions, such as wind, water, dust, mud, ice, etc. The external microphones also have to be arranged on the exterior of the vehicle such that they capture the desired sound and, at the same time, capture only little unwanted sound such as, e.g., wind noise. The microphone arrangement as disclosed herein is essentially arranged to capture desired sound while being protected against environmental conditions, especially during those times when the microphone is not in use. In addition, the disclosed microphone arrangement can be easily integrated in a vehicle without impairing its appearance. These aspects and others will be discussed in more detail below.

Figure 1:
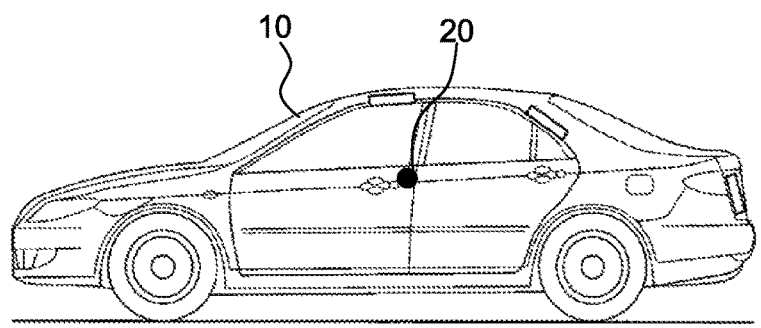
FIG. 1 schematically illustrates a vehicle comprising external microphones.

FIG. 1 schematically illustrates a side view of a vehicle 10. One or more external microphones 20 are arranged on the outside of the vehicle 10. This allows the microphones 20 to capture external sound (sounds originating from the external environment of the vehicle 10). Integrating external microphones 20 in a vehicle 10 is generally a challenge. The microphones 20 need to be arranged in suitable positions to be able to capture the desired sounds. At the same time, the integration of external microphones 20 should not significantly change the appearance of the vehicle 10.

A hole or recess may be provided in the vehicle 10 for receiving the microphone 20. The microphone 20 may include an outer grille cover, which is mounted on the vehicle 10. In one example, the grille cover includes a first plurality of holes to minimize the amount of wind generated noise seen by the microphone 20 during use of the microphone 20, while the cover has an overall large opening to enable the sound to pass without any acoustic transformation. A microphone element may be mounted on a printed circuit board (PCB) that is located inside the vehicle 10. The opening of the cover may enable the exterior acoustic signal to pass to the microphone element.

An acoustic membrane may be mounted on the opposite side of the printed circuit board. The acoustic membrane protects the microphone from water and dust. The acoustic membrane may be arranged to protect the microphone element against a direct jet spray of water. The grille design also protects the microphone element against a direct water jet spray. The external microphone apparatus may provide venting to enable liquid to pass through it and maintain its acoustic functionality. This may be accomplished by providing a gap between the grille and microphone cover. Water and debris can flow through the grille and then be washed away through the gap. The venting membrane as positioned on the microphone element side of the housing provides for the relief of pressure caused by climatic changes.

Figure 2:
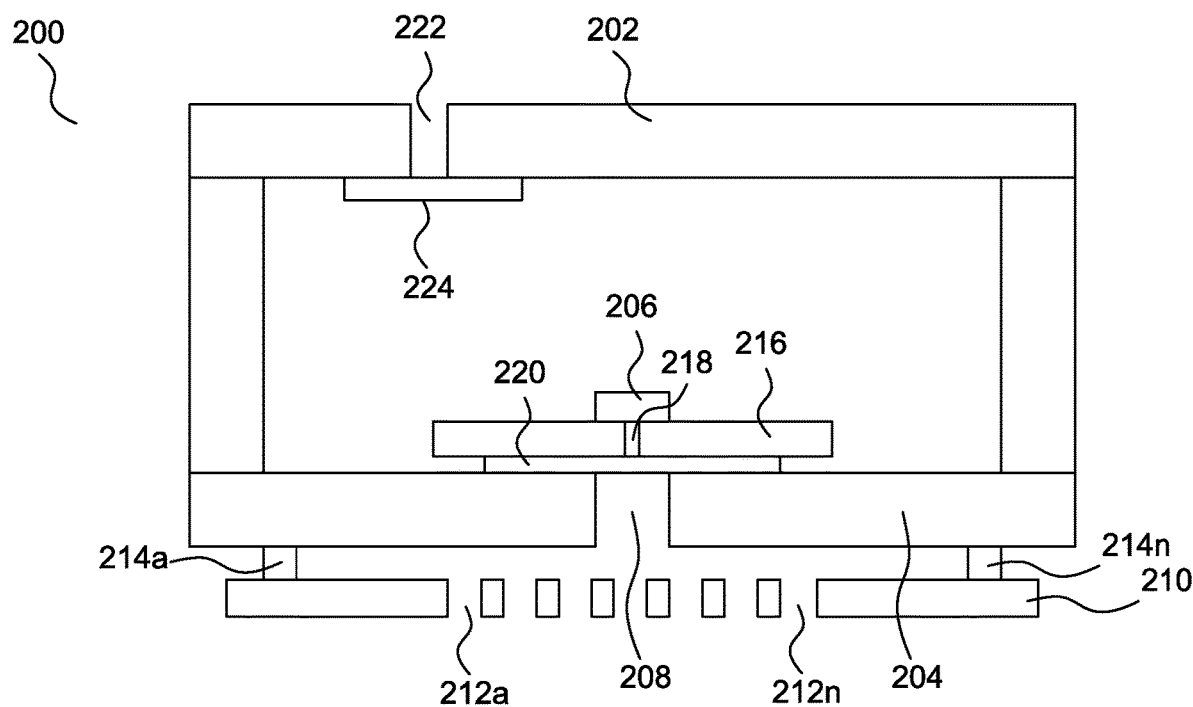
FIG. 2 schematically illustrates a microphone.

A cross-sectional view of a microphone 200 is schematically illustrated in FIG. 2. The microphone 200 may include a housing 202, a cover 204, and at least one microphone element 206 (hereafter "the microphone element 206"). The microphone 200 is generally configured to be mounted on a vehicle 10. It is recognized that a portion of the vehicle 10 that houses the microphone 200 may define a cavity (not shown) that is suitable to receive the microphone 200. The microphone element 206 arranged inside the housing 202 is generally configured to detect ambient noise external to the vehicle 10 and to provide the detected ambient noise to any controller (or processor, not shown) positioned in or about the vehicle 10. The detected ambient noise may be provided to a controller wirelessly or via a wired connection, for example.

The housing 202 and the cover 204 can cooperate with one another to surround the microphone element 206. The cover 204 may be orientated to face out, and away from the vehicle 10 into the environment that surrounds the vehicle 10. The housing 202 and the cover 204 may be separate components. For example, the cover 204 may be formed by an element of the vehicle 10. It is, however, also possible that the cover 204 and the housing 202 are integrally formed. That is, the cover 204 may be a part of the housing 202.

In one example, the microphone element 206 may be implemented as a Micro-Electro-Mechanical Systems (MEMS) microphone. The cover 204 may define a first opening 208 to enable the microphone element 206 to detect audio external to the vehicle 10. The first opening 208 enables the entry of acoustic sound without transforming the sound prior to receipt by the microphone element 206. A grilled cover 210 may be positioned in front of the cover 204. In one example, the grilled cover 210 may be formed of sheet metal. The grilled cover 210 may be axially spaced (or offset) from the cover 204.

The grilled cover 210 may or may not extend in parallel with respect to the cover 204. For example, the grilled cover 210 may be straight. Alternatively, the grilled cover 210 may define at least one plane that extends with a radius with respect to the cover 204. The grilled cover 210 may define a plurality of audio holes 212a-212n to enable audio to enter the first opening 208 for receipt by the microphone element 206. The diameter for each audio hole 212 may be, for example, 0.5 mm or smaller. The grilled cover 210 may include mounting portions 214a and 214n to couple the grilled cover 210 to the cover 204. It is recognized that the cover 204 and the mounting portions 214a and 214n may be integrally formed with one another.

A printed circuit board (PCB) 216 may support the microphone element 206 and may include electrical traces and bonds to electrically couple with the microphone element 206. The PCB 216 may define a second opening 218 to enable ambient sound that passes through the plurality of audio holes 212a-212n and through the first opening 208 to be received by the microphone element 206. An acoustic membrane 220 may be positioned between the PCB 216 and the cover 204. The acoustic membrane 220 may be configured to enable the audio to pass therethrough and into the second opening 218 for receipt by the microphone element 206.

The acoustic membrane 220 may be configured to serve as a barrier to prevent the entry of external debris from the vehicle 10 into an interior volume of the housing 202. For example, the acoustic membrane 220 may protect the microphone element 206 from water and/or dust or other debris. As shown, the microphone element 206 may be positioned on one side of the PCB 216 and the acoustic membrane 220 may be positioned on an opposite side of the PCB 216. It is recognized that the acoustic membrane 220 may require protection against a direct spray of water (e.g., water delivered to the acoustic membrane that exceeds a predetermined pressure value). Therefore, the grilled cover 210 may be configured to prevent or reduce the pressure level of the fluid that the acoustic membrane 220 is exposed to.

The housing 202 may define a third opening 222 on an exterior portion thereof. The third opening 222 may be positioned on a side of the housing 202 that is generally positioned within proximity of the microphone element 206. A venting membrane 224 may be positioned within a volume defined internally from within the housing 202 and may be further positioned directly over or on the third opening 222. The venting membrane 224 can provide relief from pressure resulting from climatic or atmospheric changes that take place outside of the vehicle 10.

The housing 202 of the microphone 200 may be formed in or on the vehicle. In particular, the cover 204 may be formed by an outer surface of the vehicle 10 (e.g., by the body work of the vehicle 10). According to one example, the housing 202 is integrally formed together with the outer surface of the vehicle 10. In this way, the microphone 200 can be easily integrated into the vehicle 10 in a space-saving manner while, at the same time, remaining visually unobtrusive. The microphone 200 as described with respect to FIG. 2, however, is only one example. The microphone 200 may be implemented in or on the vehicle 10 in any other suitable way.

Figure 3:
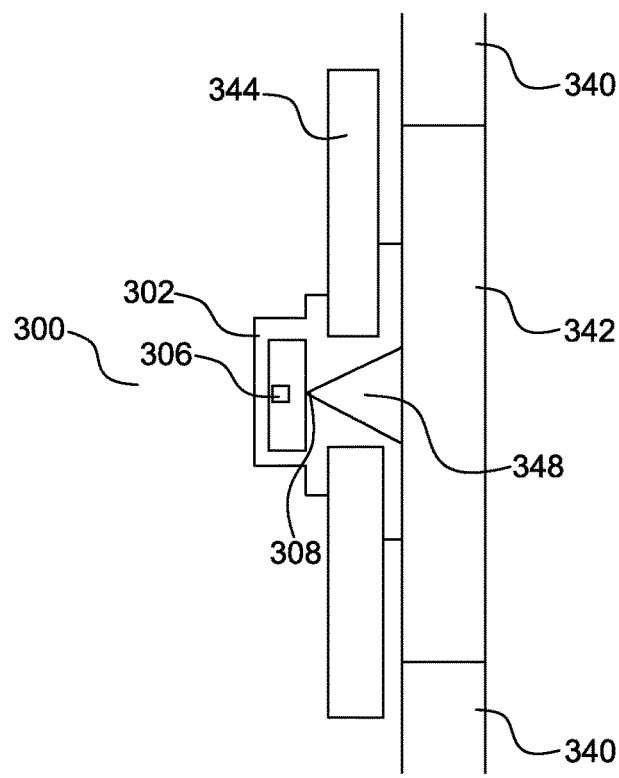
FIG. 3 schematically illustrates a closed position of a microphone arrangement according to one example.

Now referring to FIG. 3, a microphone arrangement according to one example is schematically illustrated. The microphone arrangement comprises a microphone 300. Similar to the microphone 200 that has been described with respect to FIG. 2 above, the microphone 300 comprises a housing 302 with a microphone element 306 arranged therein. The housing 302 comprises a first opening 308 to enable ambient sound to be received by the microphone element 306 inside the housing 302. A PCB (not specifically illustrated in FIG. 3) may support the microphone element 306 and may include electrical traces and bonds to electrically couple with the microphone element 306. The PCB may define a third opening to enable ambient sound that passes through the first opening 308 to be received by the microphone element 306. Optionally, the microphone 300 may further comprise any of the additional features as described with respect to FIG. 2 above.

More and more vehicles 10 today comprise retractable door handles. A retractable door handle, when not in use, is retracted in the body work of the vehicle 10 (door handle is fully or at least predominantly recessed) and may be almost invisible. In this closed position, the retractable door handle may be arranged essentially flush with the body work of the vehicle 10, for example. For this reason, fully retractable door handles are often also referred to as flush door handles. Retracting the door handle helps to slightly reduce the aerodynamic drag and is usually considered to be more aesthetic than conventional door handles. Such retractable door handles generally comprise an electric extension mechanism. When a user approaches the vehicle 10, the door handle emerges. That is, the electric extension mechanism moves the retractable door handle from a closed position, in which it is retracted in the body work of the vehicle 10, to an in-use position.

Figure 5:
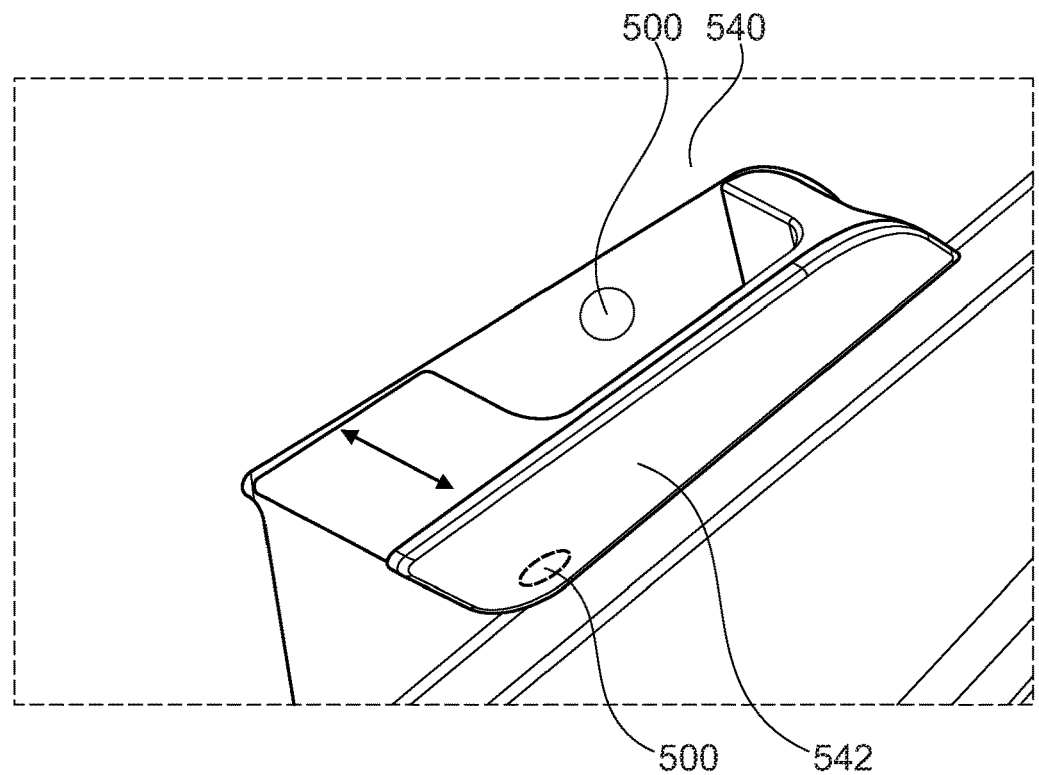
FIG. 5 schematically illustrates a microphone arrangement in an in-use position according to one example.

The microphone arrangement further comprises a retractable door handle 342. A retractable door handle 542 in an in-use position (door handle protruding/standing out from the body work 540 of the vehicle 10) is schematically illustrated in FIG. 5. FIG. 3 schematically illustrates a retractable door handle 342 in a closed position, in which it is retracted in the body work 340 of the vehicle 10. The microphone 300 in this example is arranged behind the retractable door handle 342. In particular, the microphone 300 is mounted to a handle housing 344. The handle housing 344, when the retractable door handle 342 is in its closed position, is covered by the retractable door handle 342. In this way, when the retractable door handle 342 is in its closed position, the microphone 300 is also fully covered by the retractable door handle 342. In particular, the first opening 308 of the housing 302 is covered by the retractable door handle 342. In this way, the microphone 300, and in particular the microphone element 306, are well protected from environmental conditions. Particularly harsh environmental conditions usually occur during the use of the vehicle 10. However, when the vehicle 10 is driven, the retractable door handle 342 is usually in its closed position.

External sounds, however, may not reach the microphone element 306 when the retractable door handle 342 is in its closed position. The handle housing 344 may be formed by one or more components of the vehicle 10 (e.g., by a body in white, BIW). The handle housing 344 may define a second opening 348 which is aligned with the first opening 308 and the (optional) third opening 222 to enable ambient sound to be received by the microphone element 306 when the retractable door handle 342 is in its in-use position. The handle housing 344 may be arranged between the microphone 300 and the retractable door handle 342. The microphone 300 may be mounted to the handle housing 344 in any suitable way. In the examples illustrated in FIGS. 3 and 4, the housing 302 is merely snapped into the second opening 348 of the handle housing 344. For example, the housing 302, or at least parts of the housing 302, may be made of rubber or any other suitable flexible material that may be easily snapped into the second opening 348. It is, however, also possible to mount the housing 302 to the handle housing 344 by gluing or screwing it to the handle housing 344. Any other suitable mounting mechanism is also possible.

Figure 4:
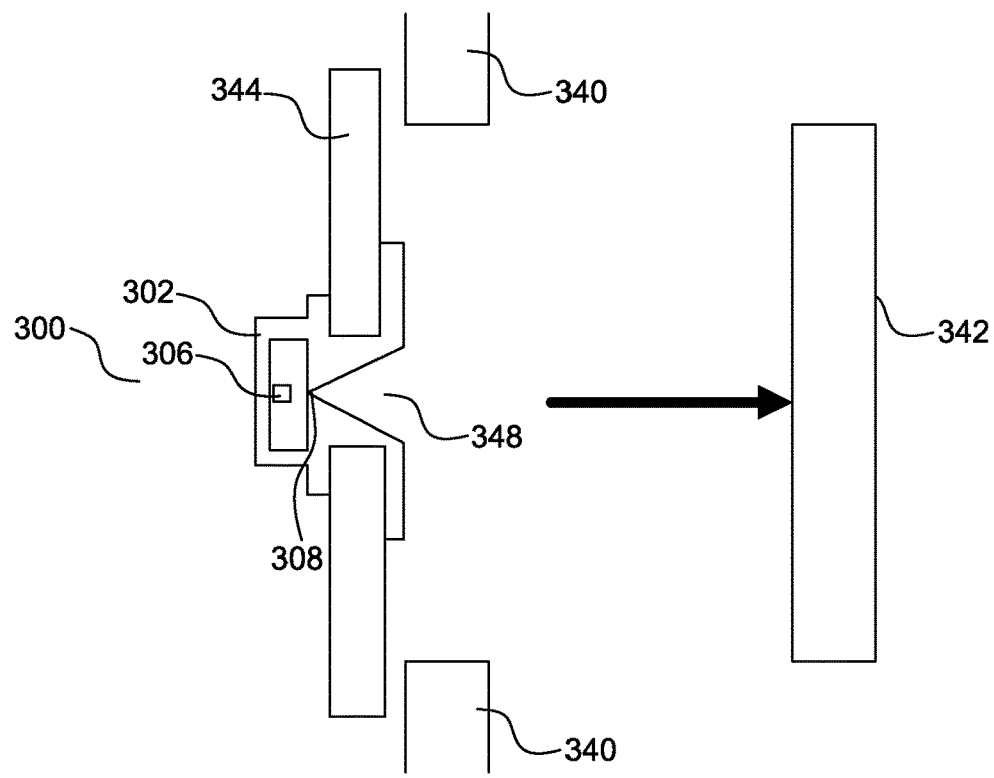
FIG. 4 schematically illustrates the microphone arrangement of FIG. 3 in an in-use position.

In the examples illustrated in FIGS. 3 and 4, the parts of the housing 302 which extend through the second opening 348 to the outside of the vehicle 10, may also form an end-stop element for the retractable door handle 342, for example.

A retractable door handle 342 in its in-use position is schematically illustrated in FIG. 4. The arrow in FIG. 4 indicates the direction in which the retractable door handle 342 is moved out and away from the body work 340 of the vehicle 10. When the retractable door handle 342 is in its in-use position, the first and second opening 308, 348 (and optionally the third opening 222) are uncovered and sound may reach the microphone element 306.

The retractable door handle 342 usually moves from its closed position to its in-use position when a driver approaches or when they exit the vehicle 10. An approaching driver may be detected when the user unlocks the vehicle 10, when a vehicle key is detected within a certain distance from the vehicle 10, by means of video monitoring, or in any other suitable way. Some vehicles 10 today detect the voice of an approaching user for use in one or more applications. For example, voice recognition may be performed to verify that the user is authorized to use the vehicle. It is also possible, for example, that the driver is recognized by means of their voice and certain adjustments may be made in accordance with an identity of the driver. For example, a driver's seat, an air conditioning system, a media system, etc. may be adjusted to the detected driver's preferred settings. Therefore, the microphone 300 may only have to capture sounds external to the vehicle 10 when the retractable door handle 342 is in its in-use position. The microphone 300, however, may not be required to capture sounds at any other times (e.g., when the vehicle is driven or parked). During those times, the microphone arrangement is well protected from environmental conditions and is not visible such that it does not disturb the vehicle's appearance.

A microphone arrangement may be provided in the driver door of a vehicle. Alternatively, or additionally, it is also possible to provide a microphone arrangement in a passenger door of the vehicle.

Figures 6, 7:
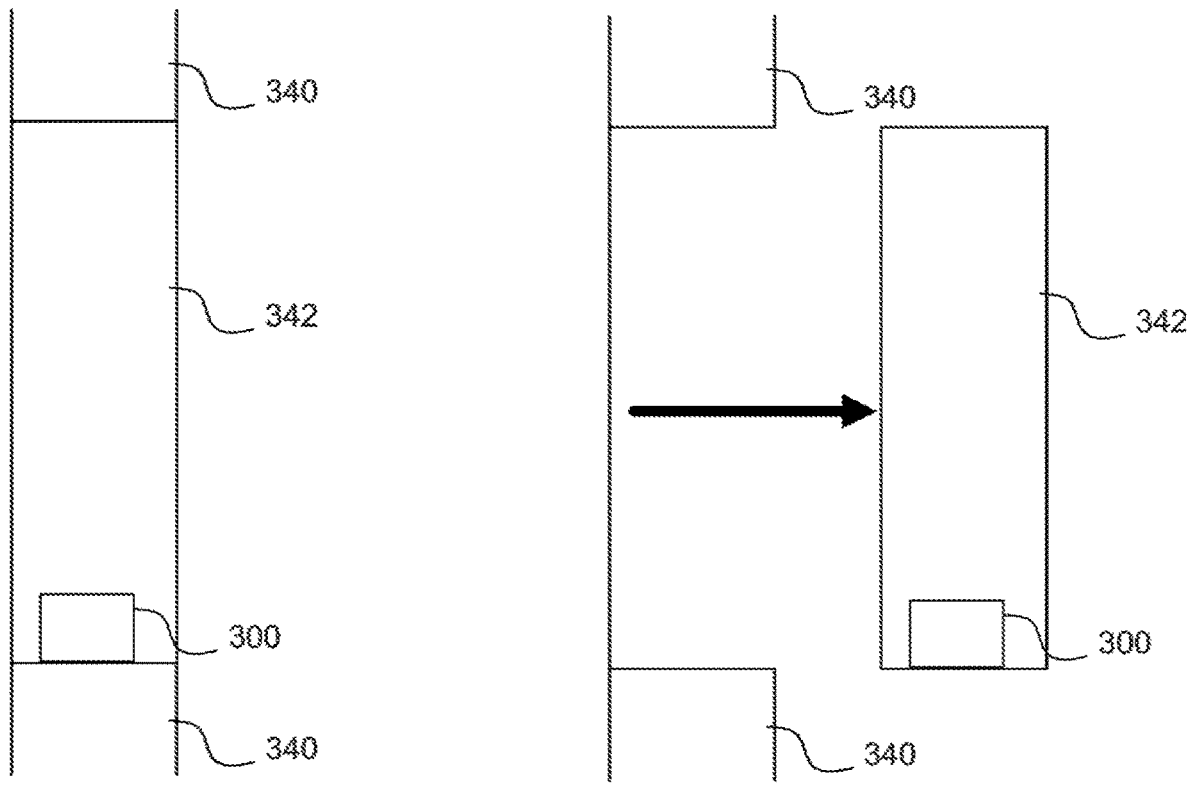
FIG. 6 schematically illustrates a closed position of a microphone arrangement according to another example.
FIG. 7 schematically illustrates the microphone arrangement of FIG. 6 in an in-use position.

It is alternatively also possible to arrange the microphone 300, 500 in the retractable door handle 342, 542 instead of in the body work 340, 540 of the vehicle 10 (i.e., in the handle housing 344). This alternative position is schematically illustrated in dashed lines in FIG. 5 as well as in FIGS. 6 (closed position) and 7 (in-use position). The desired effect is the same as in the example described with respect to FIGS. 3 and 4 above. That is, the microphone 300 is completely covered by the body work 340 and is therefore well protected when the retractable door handle 342 is in its closed position and is able to receive sounds from the outside of the vehicle 10 when the retractable door handle 342 is in its in-use position. The microphone 300 is illustrated only schematically in FIGS. 6 and 7. However, the microphone 300 in this example may comprise the same components as have been described with respect to FIGS. 2, 3 and 4 above. A portion of the retractable door handle 342 that houses the at least one microphone 300 may define at least one cavity, wherein a respective one of the at least one microphone 300 is arranged in one of the at least one cavity.

Generally, a microphone arrangement may comprise more than one microphone 300. One or more microphones 300 may be mounted to the handle housing 344 (see FIGS. 3 and 4), and additionally or alternatively one or more microphones may be mounted to the retractable door handle 342 (see FIGS. 6 and 7).

The description of embodiments has been presented for purposes of illustration and description. Suitable modifications and variations to the embodiments may be performed in light of the above description or may be acquired from practicing the methods. The described arrangements are exemplary in nature, and may include additional elements and/or omit elements. As used in this application, an element recited in the singular and proceeded with the word "a" or "an" should not be understood as excluding the plural of said elements, unless such exclusion is stated. Furthermore, references to "one embodiment" or "one example" of the present disclosure are not intended to be interpreted as excluding the existence of additional embodiments that also incorporate the recited features. The terms "first," "second," and "third," etc. are used merely as labels, and are not intended to impose numerical requirements or a particular positional order on their objects. The described systems are exemplary in nature, and may include additional elements and/or omit elements. The subject matter of the present disclosure includes all novel and non-obvious combinations and sub-combinations of the various systems and configurations, and other features, functions, and/or properties disclosed. The following claims particularly disclose subject matter from the above description that is regarded to be novel and non-obvious.

The invention claimed is:

1. A microphone arrangement comprising:
   a retractable door handle that, when in a closed position, is retracted in a body work of a vehicle, and, when in an in-use position, protrudes from the body work of the vehicle;
   a handle housing that, when the retractable door handle is in its closed position, is covered by the retractable door handle; and
   at least one microphone, each of the at least one microphone comprising a microphone element arranged in a housing, the housing comprising a first opening in order to enable the respective microphone element to detect sound, the at least one microphone is mounted to the handle housing such that the first opening is completely covered by the retractable door handle when in the closed position, and the first opening is exposed to outside air such that sound may enter the first opening, when the retractable door handle is in its in-use position; and/or
   the at least one microphone is mounted to the retractable door handle such that the first opening is completely covered by the body work when the retractable door handle is in the closed position, and the first opening is exposed to outside air such that sound may enter the first opening, when the retractable door handle is in the in-use position.

2. The microphone arrangement of claim 1, wherein the handle housing and/or the retractable door handle comprise a second opening that is aligned with the first opening of the housing.

3. The microphone arrangement of claim 2, wherein at least parts of the housing comprise a flexible material that is snapped into the second opening.

4. The microphone arrangement of claim 1, further comprising:
   a portion of the handle housing that houses the at least one microphone defines at least one cavity, and one of the at least one microphone is arranged in each one of the at least one cavity; and/or
   a portion of the retractable door handle that houses the at least one microphone defines at least one cavity, and one of the at least one microphone is arranged in each one of the at least one cavity.

5. The microphone arrangement of claim 1, further comprising an electric extension mechanism configured to move the retractable door handle from the closed position to the in-use position, and from the in-use position to the closed position.

6. The microphone arrangement of claim 1, wherein each of the at least one microphone further comprises an outer grille cover, which is mounted onto the handle housing, wherein the outer grille cover is configured to protect the respective microphone element against direct water jet spray, and to minimize an amount of wind generated noise seen by the microphone.

7. The microphone arrangement of claim 6, wherein each outer grille cover defines a plurality of audio holes to enable sound to enter the first opening for receipt by the respective microphone element.

8. The microphone arrangement of claim 1, further comprising a printed circuit board, PCB, supporting the microphone element and including electrical traces and bonds to electrically couple with the microphone element.

9. The microphone arrangement of claim 8, wherein the PCB defines a second opening to enable ambient sound that passes through the first opening to be received by the microphone element.

10. A vehicle comprising:
    a first microphone arrangement mounted to a driver door of the vehicle; and/or
    a second microphone arrangement mounted to a passenger door of the vehicle; and
    wherein,
    each of the first and second microphone arrangements further comprise:
      a retractable door handle that, when in a closed position, is retracted in a body work of the vehicle, and, when in an in-use position, protrudes from the body work of the vehicle;
      a handle housing that, when the retractable door handle is in its closed position, is covered by the retractable door handle;
      at least one microphone, each of the at least one microphone comprising a respective microphone element arranged in a housing, the housing comprising a first opening in order to enable the respective microphone element to detect sound, the at least one microphone is mounted to the handle housing such that the first opening is completely covered by the retractable door handle when in the closed position, and the first opening is exposed to outside air such that sound may enter the first opening, when the retractable door handle is in its in-use position; and/or
      the at least one microphone is mounted to the retractable door handle such that the first opening is completely covered by the body work when the retractable door handle is in the closed position, and the first opening is exposed to outside air such that sound may enter the first opening, when the retractable door handle is in the in-use position.

11. The vehicle of claim 10, wherein each of the at least one microphone is orientated to face out and away from the respective vehicle door into an environment that surrounds the vehicle.

12. The vehicle of claim 10, wherein the handle housing and/or the retractable door handle comprise a second opening that is aligned with the first opening of the housing.

13. The vehicle of claim 12, wherein at least parts of the housing comprise a flexible material that is snapped into the second opening.

14. The vehicle of claim 10, further comprising:
a portion of the handle housing that houses the at least one microphone defines at least one cavity, and one of the at least one microphone is arranged in each one of the at least one cavity; and/or
a portion of the retractable door handle that houses the at least one microphone defines at least one cavity, and one of the at least one microphone is arranged in each one of the at least one cavity.

15. The vehicle of claim 10, further comprising an electric extension mechanism configured to move the retractable door handle from the closed position to the in-use position, and from the in-use position to the closed position.

16. The vehicle of claim 10, wherein each of the at least one microphone further comprises an outer grille cover, which is mounted onto the handle housing, wherein the outer grille cover is configured to protect the respective microphone element against direct water jet spray, and to minimize an amount of wind generated noise seen by the microphone.

17. The vehicle of claim 16, wherein each grille cover defines a plurality of audio holes to enable sound to enter the first opening for receipt by the microphone element.

18. The vehicle of claim 10, further comprising a printed circuit board, PCB, supporting the microphone element and including electrical traces and bonds to electrically couple with the microphone element.

19. The vehicle of claim 18, wherein the PCB defines a second opening to enable ambient sound that passes through the first opening to be received by the microphone element.

* * * * *